(12) United States Patent
Ruohio (10) Patent No.: US 9,612,118 B2
(45) Date of Patent: Apr. 4, 2017

(54) RING GYROSCOPE STRUCTURE AND GYROSCOPE

(71) Applicant: MURATA MANUFACTURING CO., LTD., Nagaokakyo-shi, Kyoto (JP)

(72) Inventor: Jaakko Ruohio, Helsinki (FI)

(73) Assignee: MURATA MANUFACTURING CO., LTD., Nagaokakyo-Shi, Kyoto (JP)

(*) Notice: Subject to any disclaimer, the term of this patent is extended or adjusted under 35 U.S.C. 154(b) by 130 days.

(21) Appl. No.: 14/607,397

(22) Filed: Jan. 28, 2015

(65) Prior Publication Data

US 2015/0211855 A1    Jul. 30, 2015

(30) Foreign Application Priority Data

Jan. 28, 2014    (FI) ..................................... 20145086

(51) Int. Cl.
*G01C 19/5712* (2012.01)
*G01C 19/5684* (2012.01)
*B81B 3/00* (2006.01)
*G01C 19/5719* (2012.01)

(52) U.S. Cl.
CPC ........ *G01C 19/5712* (2013.01); *B81B 3/0043* (2013.01); *G01C 19/5684* (2013.01); *G01C 19/5719* (2013.01); *B81B 2201/0242* (2013.01)

(58) Field of Classification Search
CPC ............ G01C 19/5712; G01C 19/5719; G01C 19/574; G01C 19/5747; G01C 19/5642; G01C 19/42; G01C 19/5677; G01C 19/5691; G01C 19/5684

USPC ........................................ 73/504.13, 504.12
See application file for complete search history.

(56) References Cited

U.S. PATENT DOCUMENTS

| | | | | |
|---|---|---|---|---|
| 5,025,346 A * | 6/1991 | Tang | ..................... | B81B 3/0021 361/283.1 |
| 5,226,321 A * | 7/1993 | Varnham | ............ | G01C 19/5684 73/504.13 |
| 5,616,864 A * | 4/1997 | Johnson | ............. | G01C 19/5684 73/504.04 |
| 5,955,668 A * | 9/1999 | Hsu | ..................... | G01C 19/5719 73/1.37 |
| 6,250,157 B1 * | 6/2001 | Touge | ................ | G01C 19/5719 73/504.12 |

(Continued)

FOREIGN PATENT DOCUMENTS

EP    0 461 761 A1    12/1991
EP    2 573 516 A1    3/2013
(Continued)

OTHER PUBLICATIONS

International Search Report application No. PCT/IB2015/050640 dated May 21, 2015.
(Continued)

*Primary Examiner* — Helen Kwok
(74) *Attorney, Agent, or Firm* — Squire Patton Boggs (US) LLP (57) ABSTRACT

A ring gyroscope structure with central spring structure that prefers prefers 2θ-modes and makes them low in frequency. The flexing resonance modes that tend to couple to external mechanical excitation are clearly higher that the 2θ-modes. The described structure is thus very robust against external mechanical shocks and vibrations.

14 Claims, 5 Drawing Sheets

(56) References Cited

U.S. PATENT DOCUMENTS

| | | | | |
|---|---|---|---|---|
| 7,100,446 | B1* | 9/2006 | Acar | G01C 19/5719 73/504.12 |
| 7,260,991 | B2* | 8/2007 | Maurer | G01C 19/5712 73/504.08 |
| 8,408,060 | B2* | 4/2013 | Kuang | G01C 19/5677 73/504.13 |
| 8,789,416 | B2* | 7/2014 | Rocchi | G01C 19/574 73/504.04 |
| 8,803,624 | B2* | 8/2014 | Phan Le | H03H 9/2431 331/116 M |
| 8,833,161 | B2* | 9/2014 | Zolfagharkhani | G01C 19/5755 73/504.12 |
| 2004/0112134 | A1 | 6/2004 | Beitia | |
| 2004/0144174 | A1 | 7/2004 | Fell et al. | |
| 2004/0211257 | A1* | 10/2004 | Geen | G01C 19/5712 73/504.04 |
| 2010/0058861 | A1* | 3/2010 | Kuang | G01C 19/5677 73/504.12 |
| 2011/0061460 | A1 | 3/2011 | Seeger et al. | |
| 2012/0006113 | A1* | 1/2012 | Zolfagharkhani | G01C 19/5755 73/504.12 |
| 2013/0167636 | A1* | 7/2013 | Coronato | G01C 19/42 73/504.12 |
| 2014/0224016 | A1* | 8/2014 | Leclerc | G01C 19/5712 73/504.12 |
| 2015/0211854 | A1* | 7/2015 | Ruohio | G01C 19/5712 73/504.12 |

FOREIGN PATENT DOCUMENTS

| | | |
|---|---|---|
| WO | WO 2010/007406 A2 | 1/2010 |
| WO | WO 2013/140134 A1 | 9/2013 |

OTHER PUBLICATIONS

Finnish Search Report dated Sep. 25, 2014 corresponding to Finnish Patent Application No. 20145086.

Yi Tao et al., "Design, analysis and experiment of a novel ring vibratory gyroscope," Sensors and Actuators A: Physical. Apr. 19, 2011, vol. 168, No. 2, pp. 286-299.

Jui-Hong Weng et al., "Structural design and analysis of micromachined ring-type vibrating sensor of both yaw rate and linear acceleration," Sensors and Actuators A: Physical. Jan. 14, 2005, vol. 117, No. 2, pp. 230-240.

* cited by examiner

RING GYROSCOPE STRUCTURE AND GYROSCOPE

BACKGROUND

Field

The present invention relates to microelectromechanical devices and especially to a gyroscope structure and a gyroscope, as defined in the preambles of the independent claims.

Description of the Related Art

Micro-Electro-Mechanical Systems, or MEMS can be defined as miniaturized mechanical and electro-mechanical systems where at least some elements have a mechanical functionality. Since MEMS devices are created with the same tools used to create integrated circuits, micromachines and microelectronics can be fabricated on the same piece of silicon (or other substrate) to enable advanced machines.

MEMS structures can be applied to quickly and accurately detect very small changes in physical properties. For example, a microelectromechanical gyroscope can be applied to quickly and accurately detect very small angular displacements. Motion has six degrees of freedom: translations in three orthogonal directions and rotations around three orthogonal axes. The latter three may be measured by an angular rate sensor, also known as a gyroscope or gyro. MEMS gyroscopes use the Coriolis effect to measure the angular rate. When a mass is moving in one direction and rotational angular velocity is applied, the mass experiences a force in orthogonal direction as a result of the Coriolis force. The resulting physical displacement caused by the Coriolis force may then be read from, for example, a capacitive, piezoelectrical or piezoresistive sensing structure.

In MEMS gyros the primary motion is typically not continuous rotation as in conventional ones due to lack of adequate bearings. Instead, mechanical oscillation may be used as the primary motion. When an oscillating gyroscope is subjected to an angular motion orthogonal to the direction of the primary motion, an undulating Coriolis force results. This creates a secondary oscillation orthogonal to the primary motion and to the axis of the angular motion, and at the frequency of the primary oscillation. The amplitude of this coupled oscillation can be used as the measure of the angular rate.

Gyroscopes are very complex inertial MEMS sensors, and still the tendency is towards more and more compact structures. The basic challenge in gyroscope designs is that the Coriolis force is very small and therefore the generated signals tend to be minuscule compared to other electrical signals present in the gyroscope. Spurious responses and susceptibility to vibration plague many compact MEMS gyro designs, like conventional tuning fork structures.

One known approach to reduce sensitivity to external vibrations is a balanced ring structure that includes a planar vibratory resonator that has a ring or hoop like structure with inner or outer peripheries extending around a common axis. The planar resonators are typically excited into a cos 2θ resonance mode that exists as a degenerate pair of vibration modes at a mutual angle of 45°. One of these modes is excited as the carrier mode. When the structure is rotated around the axis normal to the plane of the ring, Coriolis forces couple energy into a response mode. The amplitude of motion of the response mode gives a direct measure of the applied rotation rate.

A disadvantage of the conventional ring structures is that they typically have parasitic modes below the frequency of the two operational vibration modes. Such parasitic modes couple easily to external shocks and vibrations.

SUMMARY

An object of the present invention is to provide a compact ring type gyroscope structure that is less sensitive to external shocks. The objects of the present invention are achieved with a gyroscope structure according to the claims.

In certain embodiments, the invention comprises a planar microelectromechanical gyroscope structure that comprises a circular structure that extends around a center point, a central spring structure for suspending the circular structure to four central anchor points, symmetrically located around the center point, and four central circle points and four peripheral circle points between the central circle points on the circular structure. Neighboring peripheral circle points form a pair of peripheral circle points and neighboring central circle points form a pair of central circle points. The central spring structure is configured to connect each of the four central anchor points to a pair of central circle points on the circular structure. The connection between the central spring structure and the circular structure is configured to transform a radial on-plane displacement of a first circle point of a pair of peripheral or central circle points to a reverse radial on-plane force on a second circle point of the pair of peripheral or central circle points. The direction of the radial on-plane displacement of the first circle point, and the direction of the radial on-plane force on the second circle point are orthogonal.

The claims define also a gyroscope that includes the microelectromechanical gyroscope structure. Advantageous embodiments of the invention are recited in the dependent claims.

The present invention defines a specific central spring structure that arranges the cos 2θ resonance modes (drive and sense) into lowest frequencies. This enables simple elimination of the parasitic modes.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of gyroscope structures that are generally known to a person skilled in the art may not be specifically described herein.

Figure 1:
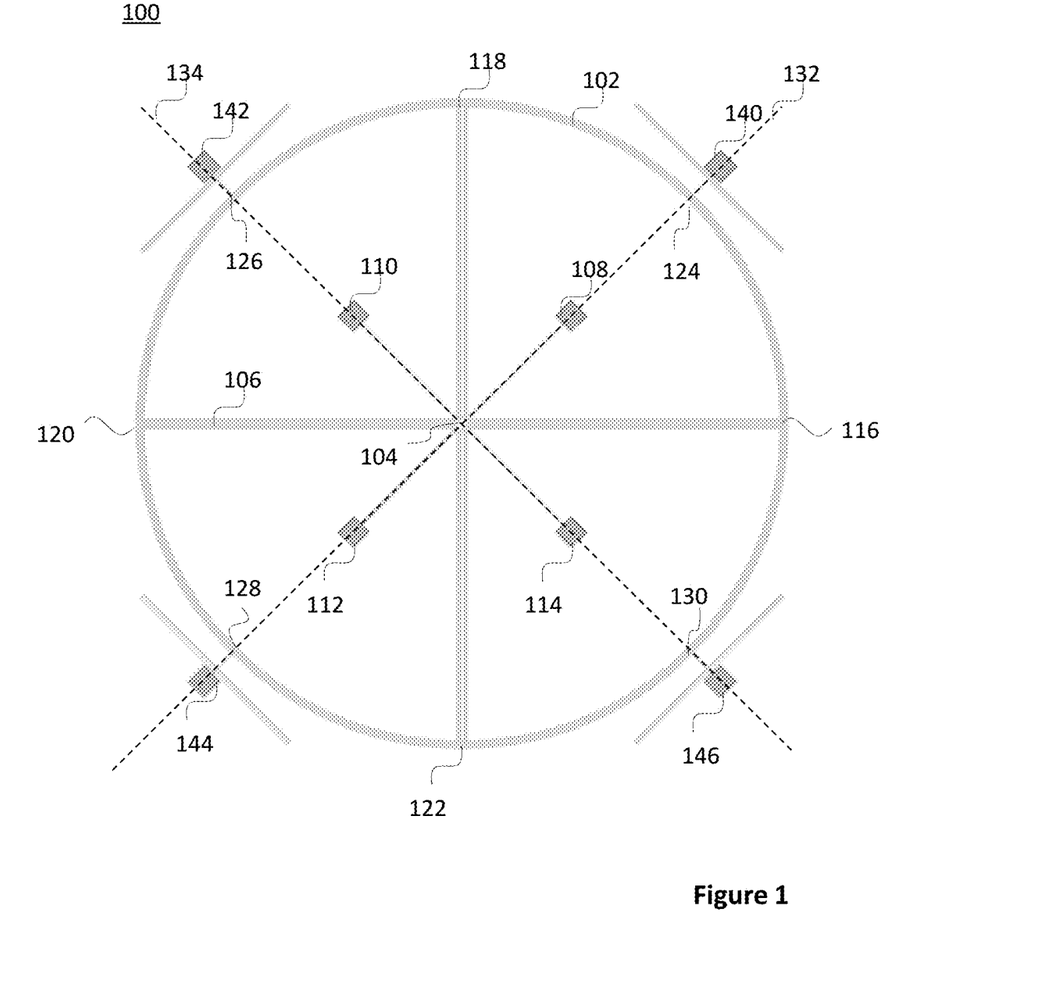
FIG. 1 illustrates an embodiment of a gyroscope structure.

FIG. 1 illustrates an embodiment of a gyroscope structure 100 according to the present invention. In FIG. 1 the gyroscope structure is shown in an initial state when it is suspended to a support base but no added external forces act upon it. The shown configuration includes a circular structure 102 that extends around a center point 104. The gyroscope structure 100 may have a planar form. This means that the circular structure 102 is aligned to a plane in two dimensions (length, width). The circular structure 100 provides for the gyroscope a seismic mass that may be excited to primary motion and whose secondary motion resulting from Coriolis forces may be detected.

A central spring structure 106 may be used to suspend the circular structure 102 to a static (non-oscillating) support, typically to another body element of a MEMS gyroscope. If the gyroscope structure is a MEMS structure wafer, the other body element may be provided, for example, by an underlying handle wafer, or a covering cap wafer of a gyroscope die. For suspension, the gyroscope structure 100 may include four central anchor points 108, 110, 112, 114 symmetrically located around the center point 104. The term anchor point refers here to a section, often an extreme section, of a spring structure through which the connection to the support is or may be created. The gyroscope structure can be considered to have two radial directions, wherein each radial direction is aligned to a diagonal line 132 or 134 that connects two central anchor points and the center point (110, 114, 104, or 108, 112, 104).

Figure 2:
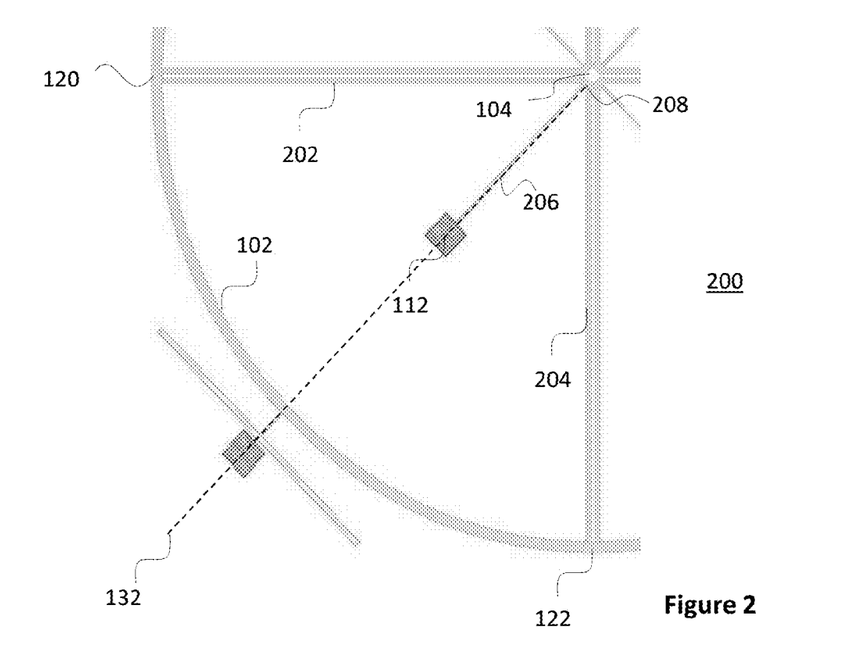
FIG. 2 illustrates in more detail an exemplary central substructure.

The central spring structure 106 may be configured to connect each of the four central anchor points 108, 110, 112, 114 to a pair of central circle points on the circular structure 102. For this, the central spring structure 106 may include four central substructures, each of which connects to two central circuit points and to one central anchor point. FIG. 2 illustrates in more detail an exemplary central substructure 200 that connects two central circuit points 120, 122 and an anchor point 112.

A circle point refers herein to a minuscule sector of the circular structure 120 to which elements of spring substructures may attach to. The contact may take place in an inner surface and an outer surface of the circular structure 102. The inner surface refers to a part of the surface of the circular structure 102 that faces radially inwards, towards the center point 104. The outer surface refers to a part of the surface of the circular structure 102 that faces radially outwards, away from the center point 104. FIG. 1 shows an exemplary configuration where the connection is made on the inner surface of the circular structure 102. The four central circle points 116, 118, 120, 122 may be evenly distributed on the inner surface of the circular structure 102, as shown in FIG. 1. Two neighboring central circle points, (e.g. 116 and 118, 118 and 120, 120 and 122, and 122 and 116) may be considered to form a pair of central circle points.

The central substructure may include at least three springs 202, 204, 206 that are elongate and stiff in the longitudinal direction. Elongate in this context means that in the plane of the circular structure, the length dimension (largest dimension in the plane) of the spring is multifold to the breadth dimension (perpendicular to the length dimension) of the spring. The stiffness of an elongate spring in its longitudinal direction corresponds to rigidity of the spring in the direction of its length dimension. Accordingly, when a spring is stiff in the longitudinal direction, it resists deformation in response to a force applied in the longitudinal direction many times more than in other directions. The elongate spring stiff in its longitudinal direction may thus be flexible in other directions.

A first spring 206 of the three springs extends in a radial direction from an central anchor point 112 to a connection point 208, where the first spring 206 connects to a second spring 202 and a third spring 204 of the central substructure. The second spring 202 extends between the connection point 208 and the first central circle point 120, and the third spring 204 extends between the connection point 208 and the second central circle point 122.

The spring substructure 200 is advantageously symmetric in respect of the diagonal line 132 that passes through it. In consequence, an angle between a line connecting the first central circle point 120 and the connection point 208 and the radial direction defined by the diagonal line 132 is equal to an angle between a line connecting the second central circle point 122 and the connection point 208 and the radial direction. It is noted that in the exemplary configuration of FIG. 2, the second spring 202 is parallel to the direction of the radial oscillation of the first central circle point 120 and the third spring 204 is parallel to the direction of the radial oscillation of the second central circle point 122. This is not, however, essential for the spring substructure. Other configurations are possible within the scope; for example, the point where the second spring and the third spring connect may be arranged to be closer to the central anchor point such that the second spring and the third spring become non-aligned with the radial oscillations of the circle points they connect to.

As may be seen from FIG. 2, the combination of the three springs 202, 204, 206 and the arc of the circular element 102 between a first central circle point 120 and a second central circle point 122 create a structure that is capable of transforming a radial on-plane displacement of the first central circle point 120 to a reverse radial on-plane force on a second circle point 122. Accordingly, when the first central circle point 120 moves inwards, towards the center point 104, the motion creates a mechanical force that pushes the circular structure 102 from the second central circle point 122 outwards, away from the center point 104. Correspondingly, when the second central circle point 122 moves inwards, the motion creates a mechanical force that pushes the circular structure 102 from the first central circle point 120 outwards, away from the center point 104. The resulting radial motions of the central circle points 120, 122 oscillate and are also orthogonal such that the direction of oscillation of the first central circle point 120 is perpendicular to the direction of oscillation of the second central circle point 122 in the plane of the circular structure 120.

Referring again to FIG. 1, on the outer surface of the circular structure 102 there may be four peripheral circle points 124, 126, 128, 130. The peripheral circle points 124, 126, 128, 130 may be evenly distributed on the outer surface, and interleaved between the central circle points 116, 118, 120, 122. Two neighboring peripheral circle points, (e.g. 124 and 126, 126 and 128, 128 and 130, and 130 and 124) may be considered to form a pair of peripheral circle points. The gyroscope structure may include a peripheral spring structure that includes four peripheral substructures, each of which includes a peripheral anchor point 140, 142, 144, and 146. The peripheral anchor points 140, 142, 144, and 146 and the central anchor points 116, 118, 120, 122 may be mutually aligned such that each of the peripheral anchor points 140, 142, 144, and 146 coincides with one of the diagonal lines 132, 134 of the microelectromechanical gyroscope structure. In the configuration of FIG. 1, central anchor points 108 and peripheral anchor points 140, 144 coincide with the diagonal line 132 and central anchor points 110, 114 and peripheral anchor points 142, 146 coincide with the diagonal line 134.

Figure 3:
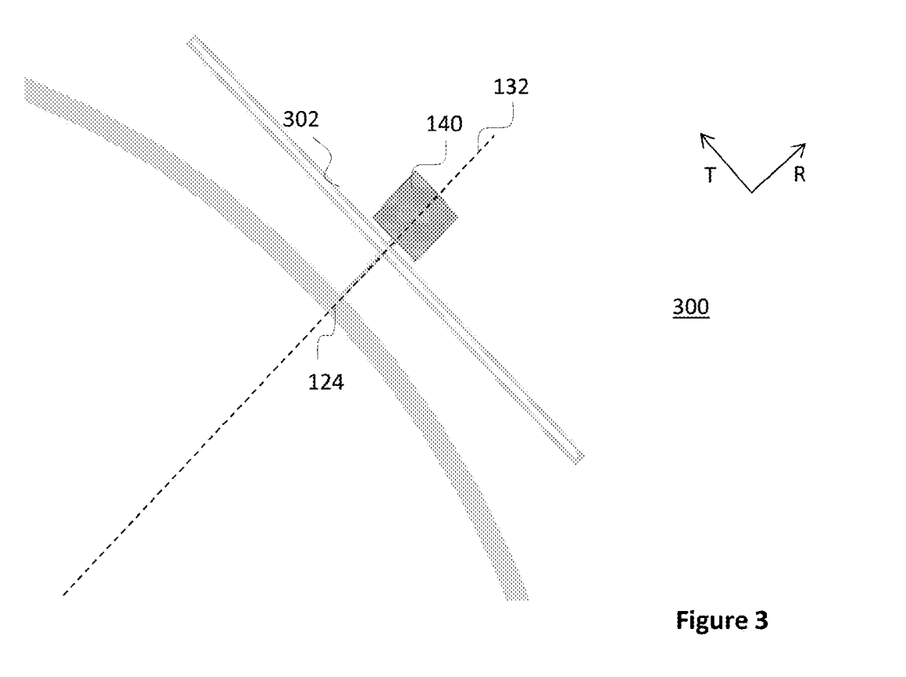
FIG. 3 illustrates an exemplary peripheral spring substructure.

FIG. 3 illustrates in more detail an exemplary peripheral spring substructure that includes the peripheral anchor point 140 of FIG. 1. The peripheral spring substructure 300 may include a fourth spring 302 that connects the peripheral anchor point 140 and the peripheral circle point 124 on the circular structure. A line connecting the peripheral anchor point 140 and the peripheral circle point 124 is advantageously aligned to a radial direction R of the diagonal line 132. The fourth spring 302 is advantageously arranged to be flexible to motion of the peripheral circle point in the radial direction R and stiff against motion of the peripheral circle point in a tangential direction T, when the tangential direction is perpendicular to the radial direction in the plane of the circular structure.

FIG. 3 illustrates an exemplary spring form, though other springs forms providing a corresponding directional function may be applied within the scope. For example, the peripheral anchor point 140, and the fourth spring may be positioned on the radial direction R of the diagonal line 132 within the circular structure. Accordingly, contacts to both the central circle points and the peripheral circle points may be on the inner surface of the circular structure 102.

In order to measure angular motion of the structure, the planar circular structure may be excited to in-plane primary motion to operate as a moving seismic mass. When a rotational angular velocity is applied, a mass moving in one direction experiences a force in orthogonal direction as a result of the Coriolis force. The resulting physical displacement (secondary oscillation) caused by the Coriolis force may then be read from, for example, a capacitive, piezoelectrical or piezoresistive sensing structure. In a ring structure, a differential mass that oscillates radially may experience a force resulting from the Coriolis effect in the tangential direction.

Accordingly, the gyroscope structure may include one or more drive structures configured to excite the primary motion by inducing radial on-plane displacements in the circular structure. The gyroscope structure may also include a sense structure configured to detect the secondary motion by sensing radial on-plane displacements of the circular structure. Due to the configuration of the structure, the drive and sense directions correspond to 2θ-modes. This means that if the drive structures are configured to drive the radial oscillation of the central circle points, the detection may be performed by sensing displacements of the peripheral circle points, or vice versa.

Figure 4A:
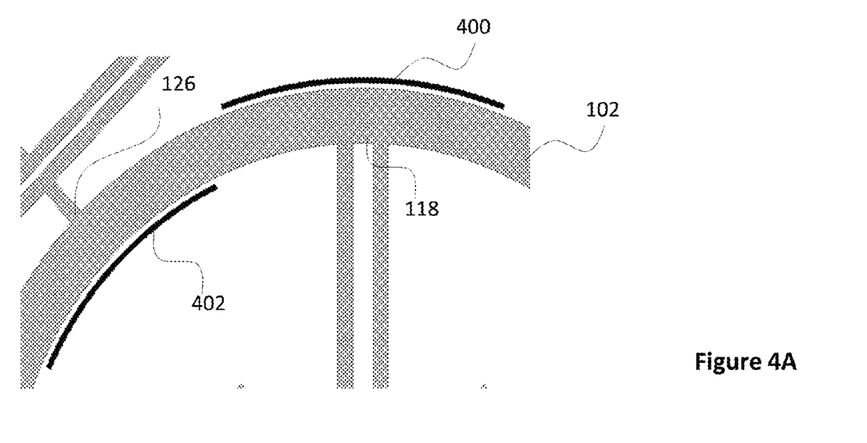
FIGS. 4A to 4C illustrate alternative drive structures applicable in the gyroscope structure.
Figure 4B:
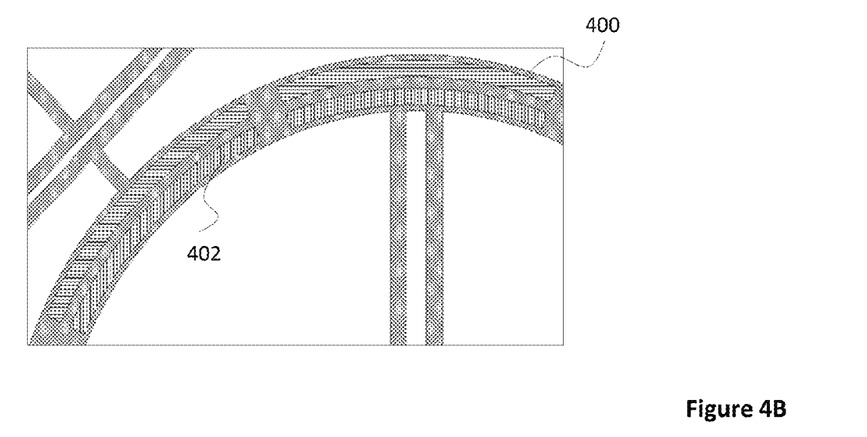
Figure 4C:
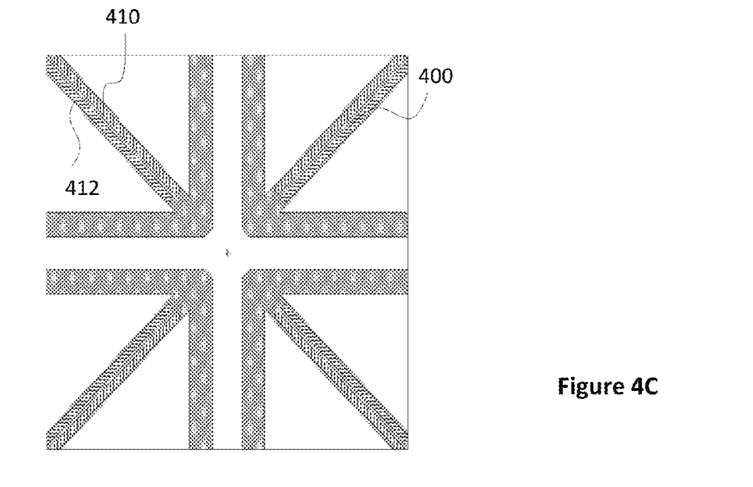

FIGS. 4A to 4C illustrate alternative drive structures applicable in the gyroscope structure of FIG. 1. FIG. 4A illustrates an exemplary configuration where excitation and detection is implemented capacitively. The drive structure 400 may include a curved electrode facing the outer surface of the circular structure 102, and the sense structure may include another curved electrode 402 facing the inner surface of the circular structure 102. When a voltage difference is applied between the circular structure 102 and the drive structure 400, the central circuit point 118 may be induced to move according to electrostatic force between the circular structure 102 and the drive electrode 400. Correspondingly, angular motion may be detected as a change of capacitance between the circular structure 102 and the sense electrode 402.

FIG. 4B illustrates a further alternative where the drive structure 400 and the sense structure 402 are implemented with piezoelectrical elements included in the circular structure.

FIG. 4C illustrates an enlarged section around the center point 104 of the gyroscope structure of FIG. 1. In this exemplary configuration, piezoelectrical means are applied to provide a drive structure 400. In the described embodiment, the first springs of the central spring substructures are divided in longitudinal direction into two electrically separated parts of piezoelectrical material. The two parts are shown with different pattern types. In operation, the first part 410 and the second part 412 may be driven in anti-phase mode. The sense structure may be implemented capacitively with a sense electrode described in FIG. 4A, or piezoelectrically with a sense element described in FIG. 4B.

Figure 5:
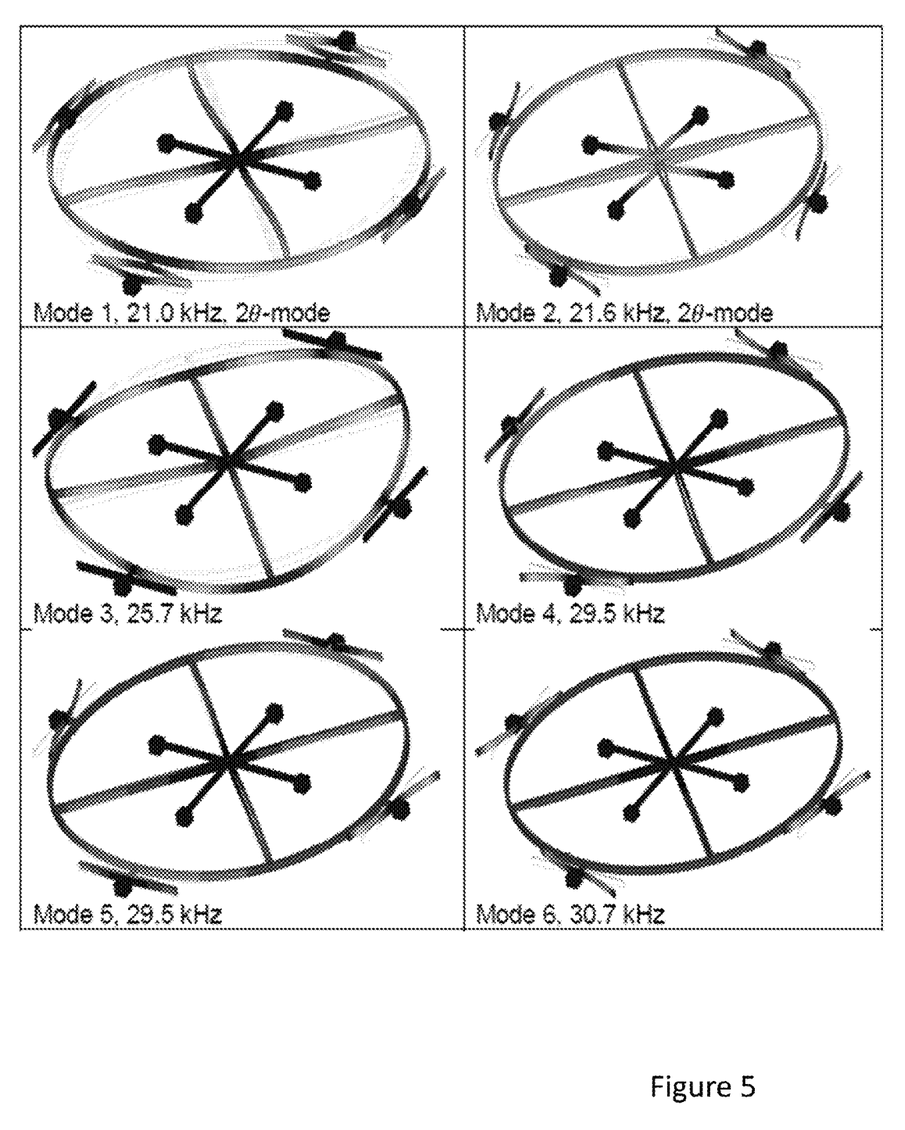
FIG. 5 illustrates vibration simulations made with a gyroscope structure.

The table of FIG. 5 illustrates simulations made for a gyroscope structure according to FIG. 1. In the simulations, the diameter of the circular structure 102 was 3 mm, the width (along the plane of the circular structure) of the circular structure 102 was 35 μm, the thickness of the circular structure 102 was 65 μm, the width of the first spring 206 of the central spring structure was 17 μm, the widths of the second and third springs 202, 204 of the central spring structure were 11 μm, and the width of the fourth spring of the peripheral spring structure was 6 μm. In the table, the resonance modes during oscillation are illustrated. As may be seen, the defined configuration of the elements prefers the 2θ-modes and makes them low in frequency. The mode that in the conventional ring gyroscopes corresponds to rotation of the circular structure about the center point is effectively eliminated by the peripheral spring structure. The flexing resonance modes that tend to couple to external mechanical excitation are clearly higher that the 2θ-modes. The described structure is thus very robust against external mechanical shocks and vibrations.

The configuration enables also avoiding excessive amplitudes that are possible when high quality factor modes become excited by mechanical vibration at resonance frequency. Furthermore, the central spring structure may be kept lean and includes few elements, and therefore enables a very compact element design.

Figure 6:
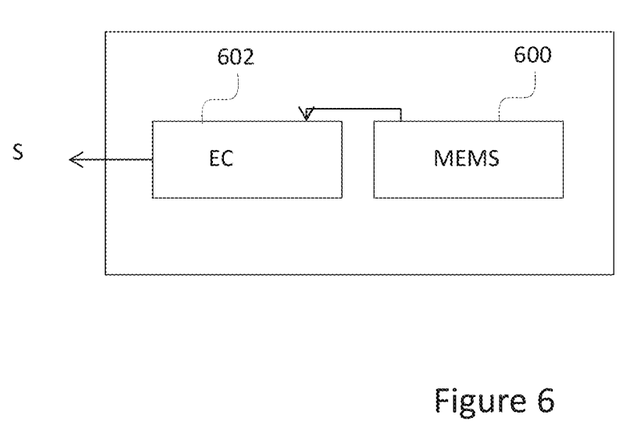
FIG. 6 illustrates elements of a gyroscope.

FIG. 6 illustrates elements of a gyroscope that includes a first part 600 and a second part 602. The first part 600 may include the gyroscope structure of FIG. 1, and the second part 602 may include an electrical circuit that is connected to at least input electrical signals from the gyroscope structure. As shown in FIG. 6, signals from one or more sense structures may be input to the electrical circuit 602 to be processed to an output signal that represents angular motion detected by the gyroscope structure.

The gyroscope may be included in a combined sensor element that includes a variety of sensor elements, a wired or mobile computing, gaming or communication device, a measurement device, a rendering device, or a vehicle function control unit, to name a few.

It is apparent to a person skilled in the art that as technology advances, the basic idea of the invention can be implemented in various ways. The invention and its embodiments are therefore not restricted to the above examples, but they may vary within the scope of the claims.

The invention claimed is:
1. A planar microelectromechanical gyroscope structure comprising:

a circular structure that extends around a center point;

a central spring structure for suspending the circular structure to four central anchor points, symmetrically located around the center point;

four central circle points and four peripheral circle points between the central circle points on the circular structure, neighboring ones of said four peripheral circle points forming a pair of peripheral circle points and neighboring ones of said four central circle points forming a pair of central circle points, wherein the central spring structure is configured to connect each of the four central anchor points to the pair of central circle points on the circular structure, wherein a connection between the central spring structure and the circular structure is configured to transform a radial on-plane displacement of a first circle point of the pair of peripheral or central circle points to a reverse radial on-plane force on a second circle point of the pair of peripheral or central circle points, wherein a direction of the radial on-plane displacement of the first circle point, and a direction of the radial on-plane force on the second circle point, are orthogonal.

2. The microelectromechanical gyroscope structure of claim 1, wherein the microelectromechanical gyroscope structure is disposed in two radial directions, wherein each radial direction is aligned to a diagonal line that connects two central anchor points and the center point, wherein the central spring structure includes four central substructures wherein a central substructure includes at least three springs that are elongate and stiff in a longitudinal direction, wherein a first spring of the at least three springs extends in one of the two radial directions from a central anchor point to a connection point, where the first spring connects to a second spring and a third spring of the three springs, wherein the second spring extends between the connection point and the first central circle point, and wherein the third spring extends between the connection point and the second central circle point.

3. The microelectromechanical gyroscope structure of claim 2, wherein an angle between a line connecting the first central circle point and the connection point and the one radial direction is equal to an angle between a line connecting the second central circle point and the connection point and the one radial direction.

4. The microelectromechanical gyroscope structure of claim 2, further comprising a peripheral spring structure that includes four peripheral anchor points symmetrically located around the center point.

5. The microelectromechanical gyroscope structure of claim 4, wherein the four peripheral anchor points and the four central anchor points are positioned such that each of the peripheral anchor points coincides with one of the diagonal lines of the microelectromechanical gyroscope structure.

6. The microelectromechanical gyroscope structure of claim 4, wherein the peripheral spring structure includes four peripheral substructures, wherein each peripheral substructure includes a fourth spring that connects a peripheral anchor point of the four peripheral anchor points and a peripheral circle point of the four peripheral circle points on the circular structure, a line connecting the peripheral anchor point and the peripheral circle point being aligned to one of the two radial directions.

7. The microelectromechanical gyroscope structure of claim 6, wherein the fourth spring is flexible to motion of the peripheral circle point in the radial direction and opposes motion of the peripheral circle point in a tangential direction, wherein the tangential direction is perpendicular to the one radial direction.

8. The microelectromechanical gyroscope structure of claim 1, wherein the radial on-plane displacements of the central circle points include linear oscillation in a radial direction of a circle of the circular structure.

9. The A microelectromechanical gyroscope structure of claim 8, further comprising a drive structure configured to induce radial on-plane displacements of the central circle points.

10. The microelectromechanical gyroscope structure of claim 9, further comprising a sense structure configured to detect radial on-plane displacements of the peripheral circle points.

11. The microelectromechanical gyroscope structure of claim 8, further comprising a drive structure configured to induce radial on-plane displacements of the peripheral circle points.

12. The microelectromechanical gyroscope structure of claim 9, further comprising a sense structure configured to detect radial on-plane displacements of the central circle points.

13. The microelectromechanical gyroscope structure of claim 9, wherein the radial on-plane displacements are induced or detected piezoelectrically or capacitively.

14. A gyroscope, including the microelectromechanical gyroscope structure of claim 1.

* * * * *